United States Patent
Tian

(10) Patent No.: US 12,354,703 B2
(45) Date of Patent: Jul. 8, 2025

(54) MEMORY DEVICE AND ZQ CALIBRATION METHOD

(71) Applicant: CHANGXIN MEMORY TECHNOLOGIES, INC., Hefei (CN)

(72) Inventor: Kai Tian, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 69 days.

(21) Appl. No.: 18/364,026

(22) Filed: Aug. 2, 2023

(65) Prior Publication Data
US 2023/0420009 A1 Dec. 28, 2023

Related U.S. Application Data

(63) Continuation of application No. PCT/CN2022/123918, filed on Oct. 8, 2022.

(30) Foreign Application Priority Data

Jun. 22, 2022 (CN) .......................... 202210716323.5

(51) Int. Cl.
*G11C 7/10* (2006.01)
*G11C 29/02* (2006.01)

(52) U.S. Cl.
CPC .......... *G11C 7/1063* (2013.01); *G11C 29/028* (2013.01); *G11C 2207/2254* (2013.01)

(58) Field of Classification Search
CPC ....... G11C 7/1063; G11C 7/02; G11C 7/1084; G11C 29/028; G11C 29/50008;
(Continued)

(56) References Cited

U.S. PATENT DOCUMENTS 10,090,064 B2   10/2018   Pan
10,276,220 B2    4/2019   Jeon et al.
(Continued)

FOREIGN PATENT DOCUMENTS

CN   108133724 A   6/2018
CN   110036379 A   7/2019
(Continued)

OTHER PUBLICATIONS

International Search Report cited in PCT/CN2022/123918 mailed Dec. 28, 2022, 8 pages.

*Primary Examiner* — Sultana Begum
(74) *Attorney, Agent, or Firm* — Syncoda LLC; Feng Ma

(57) ABSTRACT

The present disclosure provides a memory device and a ZQ calibration method. The memory device includes a master chip and a plurality of slave chips. The master chip and the slave chips are each provided with a first transmission terminal and a second transmission terminal, where the first transmission terminals are connected to each other, and the second transmission terminals are connected to each other; and a first signal receiver and an address transmitter are provided in the master chip, and a second signal receiver is provided in the slave chip, the address transmitter is configured to send an address signal; a current slave chip sends the ZQ flag signal after completing the calibration; and the address transmitter is configured to send a next address signal.

14 Claims, 3 Drawing Sheets

(58) Field of Classification Search
CPC .......... G11C 29/022; G11C 2207/2254; G11C 5/063; G11C 11/4093
See application file for complete search history.

(56) References Cited

U.S. PATENT DOCUMENTS

| | | | |
|---|---|---|---|
| 10,504,571 B1* | 12/2019 | Johnson | G11C 11/4076 |
| 10,720,221 B2 | 7/2020 | Yamamoto et al. | |
| 11,101,802 B2 | 8/2021 | Choi | |
| 11,508,420 B2 | 11/2022 | Lee et al. | |
| 2016/0012865 A1 | 1/2016 | Lee et al. | |
| 2021/0065803 A1* | 3/2021 | Lee | G11C 5/04 |
| 2021/0110855 A1 | 4/2021 | Johnson et al. | |

FOREIGN PATENT DOCUMENTS

| | | |
|---|---|---|
| CN | 110085274 A | 8/2019 |
| CN | 110534140 A | 12/2019 |

* cited by examiner

MEMORY DEVICE AND ZQ CALIBRATION METHOD

CROSS-REFERENCE TO RELATED APPLICATIONS

This is a continuation of International Patent Application No. PCT/CN2022/123918, filed on Oct. 8, 2022, which claims the priority to Chinese Patent Application No. 202210716323.5, titled "MEMORY DEVICE AND ZQ CALIBRATION METHOD" and filed on Jun. 22, 2022. The disclosures of International Patent Application No. PCT/CN2022/123918 and Chinese Patent Application No. 202210716323.5 are incorporated herein by reference in their entireties.

TECHNICAL FIELD

The present disclosure relates to, but is not limited to, a memory device and a ZQ calibration method.

BACKGROUND

ZQ calibration is a very important function in a dynamic random access memory (DRAM), specifically related to whether the output impedance of an output port is accurate, and whether the termination resistance of an input port is accurate. The offset of these parameters may cause severe distortion of a signal due to impedance mismatch during transmission, and a higher signal frequency leads to greater effects of the distortion on the signal.

The number of ZQ calibration resistors required by a low power double data rate 5 (LPDDR5) has been specified in the package definition of joint electron device engineering council (JEDEC). For example, there is one ZQ calibration resistor for a DIS315 chip, and two ZQ calibration resistors for a POP496 chip. Hence, the number of the ZQ calibration resistors in the LPDDR5 is significantly less than the number of the ZQ calibration resistors in an LPDDR4.

With the increasing demand for LPDDR capacity, more and more chips need to be placed in one LPDDR package. However, each chip requires individual ZQ calibration due to individual differences. Especially for an LPDDR5 package, the number of the ZQ calibration resistors is significantly less than that in the LPDDR4, and more chips are required to share one ZQ. How to realize a plurality of chips sharing the ZQ calibration resistor for ZQ calibration is an urgent technical problem to be solved at present.

SUMMARY

An overview of the subject described in detail in the present disclosure is provided below, which is not intended to limit the protection scope of the claims.

The present disclosure provides a memory device and a ZQ calibration method.

A first aspect of the present disclosure provides a memory device, including: a master chip and a plurality of slave chips, wherein the master chip and the plurality of slave chips are connected to a same calibration resistor; the master chip and the plurality of slave chips are each provided with a first transmission terminal and a second transmission terminal, the first transmission terminal of the master chip and the first transmission terminals of the plurality of slave chips are connected to each other, and the second transmission terminal of the master chip and the second transmission terminals of the plurality of slave chips are connected to each other; the first transmission terminals are configured to transmit a ZQ flag signal, and the second transmission terminals are configured to transmit an address signal; and a first signal receiver and an address transmitter are provided in the master chip, and a second signal receiver is provided in each of the plurality of slave chip, wherein the first signal receiver is configured to receive, by a ZQ signal terminal, a ZQ calibration command provided by a memory, the master chip starts calibration based on the ZQ calibration command, the master chip sends the ZQ flag signal through the first transmission terminal after completing the calibration, and the ZQ flag signal indicates that a current chip has completed calibration by using the calibration resistor; the address transmitter sends the address signal through the second transmission terminal, and the address signal represents an address of a slave chip in the plurality of slave chip which will perform ZQ calibration; the second signal receiver is configured to match the address signal and receive the ZQ flag signal through the first transmission terminal, a slave chip in the plurality of slave chip matching the address signal starts the calibration based on the ZQ flag signal, and a current slave chip in the plurality of slave chip sends the ZQ flag signal through the first transmission terminal after completing the calibration; and the address transmitter continues to send a next address signal through the second transmission terminal, until the calibration of all of the plurality of slave chips is completed.

A second aspect of the present disclosure provides a ZQ calibration method, applied to the memory device according to the first aspect above, and including: in a command mode, obtaining a ZQ calibration command applied outside the memory device, or in a background mode, obtaining a clock signal or a power-on signal applied outside the memory device; performing a first calibration on a master chip in response to the ZQ calibration command, the clock signal or the power-on signal; after the first calibration being completed, sending a ZQ flag signal and an address signal, and performing a second calibration on the master chip; performing, in response to the ZQ flag signal, the first calibration on a slave chip corresponding to the address signal; after the first calibration on the slave chip being completed, transmitting the ZQ flag signal, and performing the second calibration on the slave chip; resending the address signal by the master chip, and performing, in response to the ZQ flag signal, the first calibration on the slave chip corresponding to the address signal, until all of the plurality of slave chips complete the first calibration; and performing the second calibration on a slave chip that is the last one to complete the first calibration.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely referring to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

It can be known from the background that with the increasing demand for a larger LPDDR capacity, more and more chips need to be placed in one LPDDR package. However, each chip requires individual ZQ calibration due to its unique presence. Especially for an LPDDR5 package, the number of the ZQ calibration resistors is significantly less than that in the LPDDR4, and more chips are required to share one ZQ.

An embodiment of the present disclosure provides a memory device. A new control circuit is designed to realize that a plurality of chips share a ZQ calibration resistor.

Those of ordinary skill in the art should understand that many technical details are proposed in the embodiments of the present disclosure to make the present disclosure better understood. However, even without these technical details and various changes and modifications made based on the following embodiments, the technical solutions claimed in the present disclosure may still be realized. The following divisions of the various embodiments are intended for convenience of description, and are not intended to constitute any limitation to the specific implementation of the present disclosure. The various embodiments may be combined with each other in case of no contradiction.

Figure 1:
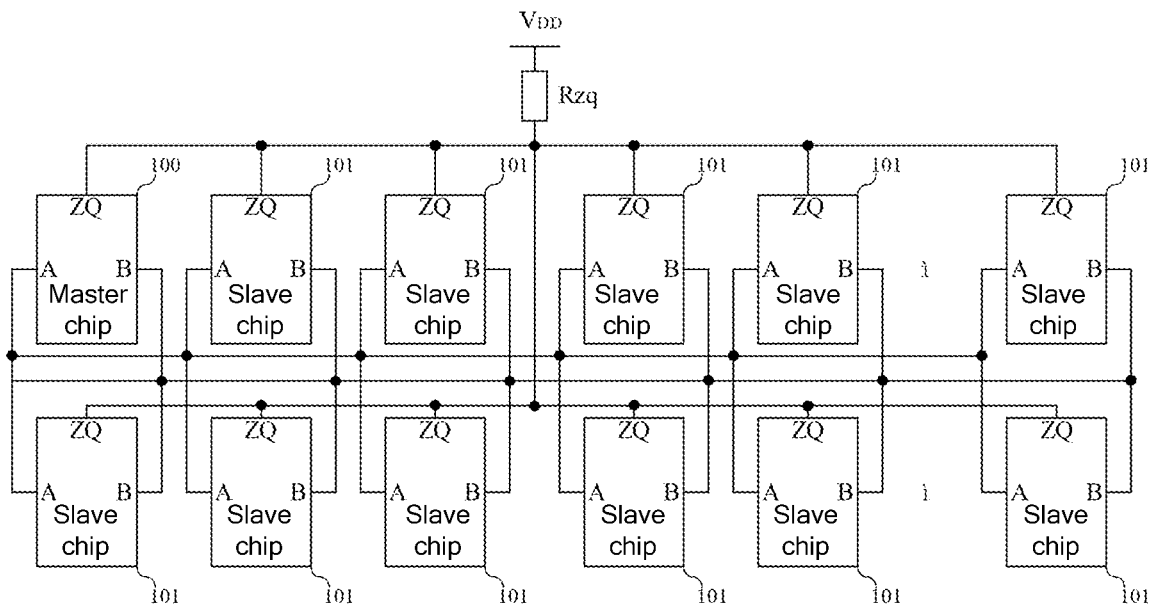
FIG. 1 is a schematic structural diagram of a memory device according to an embodiment of the present disclosure.
Figure 2:
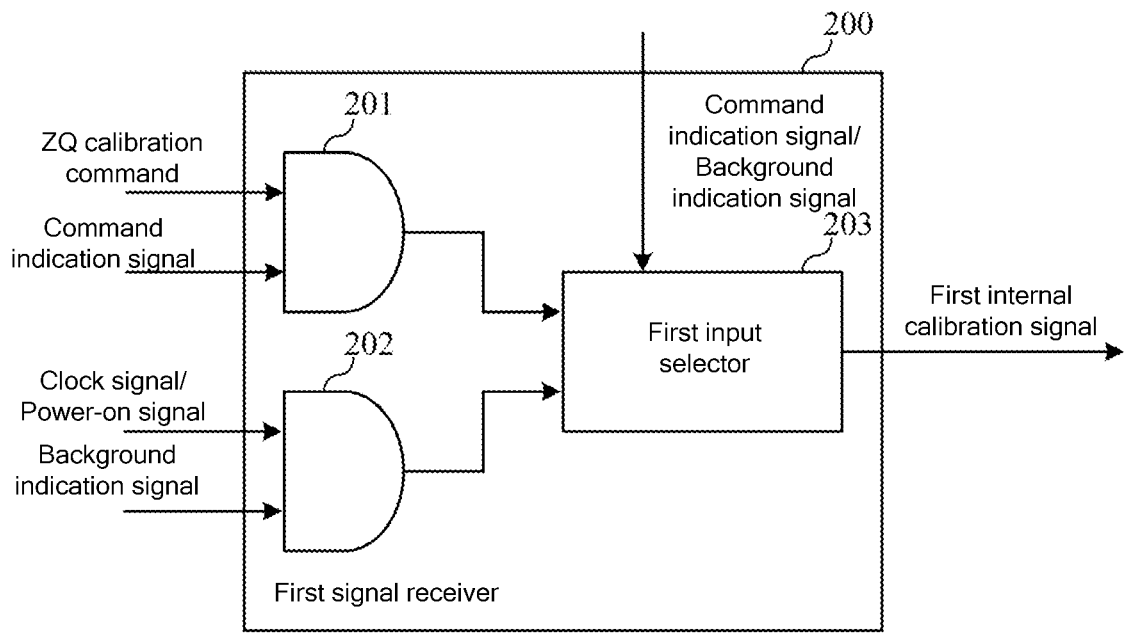
FIG. 2 is a schematic structural diagram of a first signal receiver according to an embodiment of the present disclosure.
Figure 3:
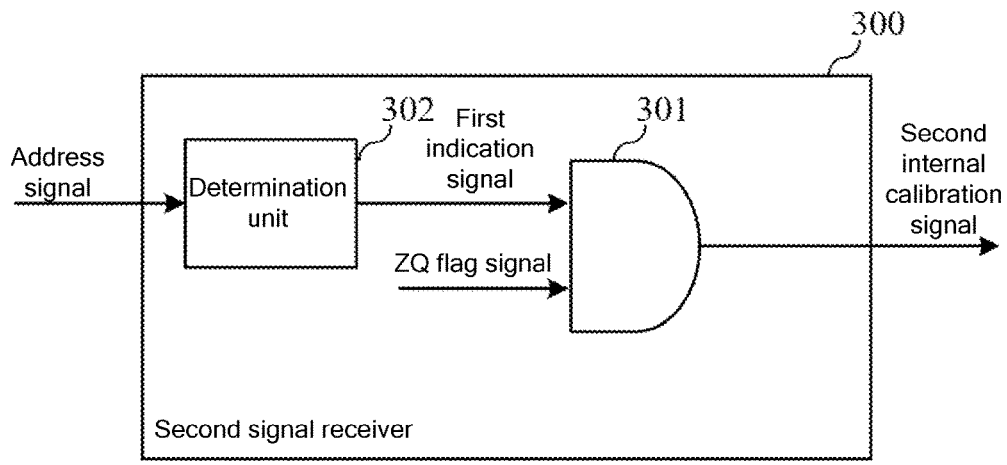
FIG. 3 is a schematic structural diagram of a second signal receiver according to an embodiment of the present disclosure.
Figure 4:
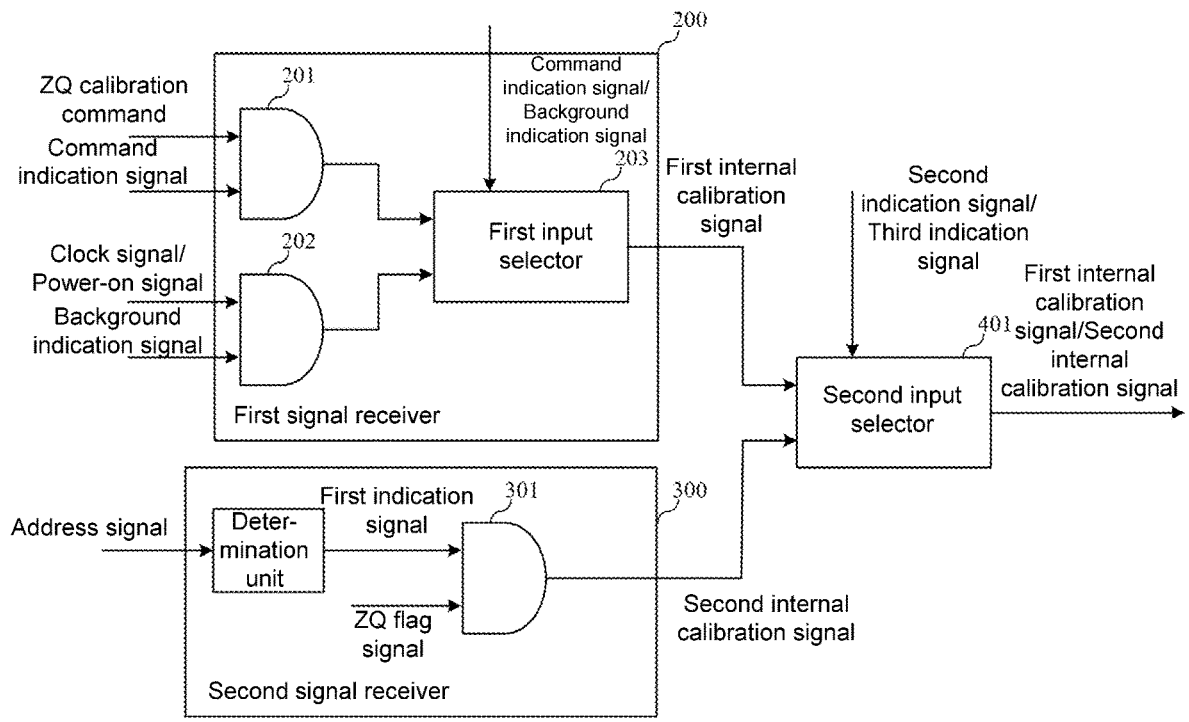
FIG. 4 is a schematic structural diagram of integration of a first signal receiver and a second signal receiver according to an embodiment of the present disclosure.

FIG. 1 is a schematic structural diagram of a memory device according to this embodiment. FIG. 2 is a schematic structural diagram of a first signal receiver according to this embodiment. FIG. 3 is a schematic structural diagram of a second signal receiver according to this embodiment. FIG. 4 is a schematic structural diagram of integration of a first signal receiver and a second signal receiver according to this embodiment. The structure of the memory device according to this embodiment is described in detail below with reference to the accompanying drawings, and the details are as follows:

Referring to FIG. 1, the memory device includes:

a master chip 100 and a plurality of slave chips 101, where the master chip 100 and the slave chips 101 are connected to a same calibration resistor Rzq.

For example, the calibration resistor Rzq has one terminal connected to ZQ terminals of the master chip 100 and the slave chips 101 and the other terminal configured to receive a calibration voltage VDD.

The master chip 100 and the slave chips 101 are each provided with a first transmission terminal A and a second transmission terminal B. The first transmission terminal A of the master chip 100 and the first transmission terminals A of the slave chips 101 are connected to each other, and the second transmission terminal B of the master chip 100 and the second transmission terminals B of the slave chips 101 are connected to each other. The first transmission terminal A is configured to transmit a ZQ flag signal, and the second transmission terminal B is configured to transmit an address signal.

It should be noted that, in the subsequent expressions, to reflect the differences between the slave chips 101, a first slave chip, a second slave chip, . . . an (N−1)-th slave chip and an N-th slave chip are expressed, where N is the number of the slave chips 101.

A first signal receiver and an address transmitter are provided in the master chip 100, and a second signal receiver is provided in the slave chip 101.

For example, the first signal receiver is configured to receive, by a ZQ signal terminal, a ZQ calibration command provided by a memory, the master chip 100 starts calibration based on the ZQ calibration command, the master chip 100 sends the ZQ flag signal through the first transmission terminal A after completing the calibration, and the ZQ flag signal indicates that a current chip has been calibrated by using the calibration resistor Rzq. The address transmitter sends the address signal through the second transmission terminal B, and the address signal represents an address of the slave chip 101 to be subjected to ZQ calibration. The second signal receiver is configured to match the address signal and receive the ZQ flag signal through the first transmission terminal A. The slave chip 101 matching the address signal starts the calibration based on the ZQ flag signal. A current slave chip 101 sends the ZQ flag signal through the first transmission terminal A after completing the calibration. The address transmitter continues to send a next address signal through the second transmission terminal B, until all the slave chips 101 have been calibrated.

In the memory device provided in this embodiment, the first transmission terminals A of the master chip 100 and all the slave chips 101 are connected to a same bus, and the second transmission terminals B of the master chip 100 and all the slave chips 101 are connected to a same bus. That is, a broadcast loop is formed between the master chip 100 and all the slave chips 101 through two buses. In the process of performing the ZQ calibration, the master chip 100 firstly performs the ZQ calibration. After the master chip 100 completes the ZQ calibration, the address of one slave chip 101 is broadcasted, and the slave chip having the matched address performs the ZQ calibration based on the ZQ flag signal in response to the broadcasted address. After the slave chip completes the ZQ calibration, the ZQ flag signal is released. The master chip continues to broadcast the address of another slave chip 101, until all the slave chips 101 complete the ZQ calibration. For the memory device provided in this embodiment, all the chips are connected to the two buses, simplifying the design of a memory device package substrate.

It should be noted that the content "the first signal receiver is configured to receive, through a ZQ signal terminal, a ZQ calibration command provided by a memory, the master chip 100 starts calibration based on the ZQ calibration command" mentioned above is a calibration logic of the master chip 100 in the command mode. In the background mode, the first signal receiver is configured to receive, through the ZQ signal terminal or other signal terminals, a clock signal or a power-on signal provided by the memory, and the master chip 100 starts the calibration based on the clock signal or the power-on signal.

Based on the above discussion, it can be seen that the ZQ calibration of the slave chips 101 is driven based on the address signal, and therefore, the number of slave chips 101 set in the memory device is related to the number of bits of the address signal. In some embodiments, the number of the slave chips 101 is the same as the number of binary data included in the address signal. A maximum number of the slave chips 101 are set to increase the number of chips that share a same calibration resistor.

Based on the above discussion, it can be seen that after the master chip 100 broadcasts the addresses of all the slave chips 101, it means that all the slave chips 101 complete the ZQ calibration. After the last slave chip 101 completes the ZQ calibration and releases the ZQ flag signal, the master chip is further configured to send a flag signal, where the flag signal indicates that all the chips complete the ZQ calibration, thereby facilitating subsequent design of memory circuit and signal timing.

It should be noted that the flag signal can be arbitrarily set as a signal that can be recognized by the memory, such as an address signal of the master chip 100. This embodiment does not constitute a limitation on the way of setting the flag signal. In a specific application, the flag signal can be set according to a specific application scenario.

In some embodiments, the address transmitter includes: an address storage unit configured to store address signals of all the slave chips 101; and an address transmitting unit connected to the address storage unit and configured to sequentially send the address signals of the slave chips. Furthermore, in some embodiments, the address transmitter further includes: an address sorting unit connected to the address storage unit and the address transmitting unit and configured to sort all the address signals, where the address transmitting unit sequentially sends the sorted address signals. Furthermore, in some embodiments, the address transmitting unit is configured to sequentially send the address signals based on the ZQ flag signal. Since the ZQ flag indicates that the chips have completed the ZQ calibration, the address signal is sent according to the ZQ flag signal to start the ZQ calibration of a next slave chip 101, to avoid calibration timing disorder.

In some embodiments, referring to FIG. 2, the first signal receiver 200 includes: a first AND gate 201 having one input terminal configured to receive the ZQ calibration command and the other input terminal configured to receive a command indication signal, where the command indication signal indicates that the memory operates in a command mode; a second AND gate 202 having one input terminal configured to receive a clock signal or a power-on signal and the other input terminal configured to receive a background indication signal, where the background indication signal indicates that the memory operates in a background mode; and a first input selector 203 having a first input terminal connected to an input terminal of the first AND gate 201, a second input terminal connected to an input terminal of the second AND gate 202, a first selection terminal configured to receive the command indication signal or the background indication signal, and a first output terminal configured to output a first internal calibration signal, where the first internal calibration signal instructs the master chip 100 to perform the calibration, and the first input selector 203 is configured to connect the first input terminal to the first output terminal based on the command indication signal, or connect the second input terminal to the first output terminal based on the background indication signal.

In some embodiments, when the memory is in the command mode, the command indication signal is provided to the first signal receiver 200 of the master chip 100, and the first input selector 203 connects the first input terminal to the first output terminal based on the command indication signal. At this time, the first signal receiver 200 provides the first internal calibration signal. That is, when the first signal receiver 200 receives the ZQ calibration command, the first internal calibration signal is generated, thereby controlling the master chip 100 to perform the ZQ calibration. When the memory is in the background mode, the background indication signal is provided to the first signal receiver 200 of the master chip 100, and the first input selector 203 connects the second input terminal to the first output terminal based on the background indication signal. At this time, the first signal receiver 200 provides the first internal calibration signal. That is, when the first signal receiver 200 receives the clock signal or the power-on signal, the first internal calibration signal is generated, thereby controlling the master chip 100 to perform the ZQ calibration.

In some embodiments, referring to FIG. 3, the second signal receiver 300 includes: a determination unit 302 configured to receive the address signal transmitted through the second transmission terminal B, obtain the address signal of the slave chip 101 to which the second signal receiver 300 belongs, and send a first indication signal if the address signal transmitted through the second transmission terminal B is the same as the address signal of the slave chip 101 to which the second signal receiver 300 belongs; and a third AND gate 301 having one input terminal configured to receive the ZQ flag signal, the other input terminal configured to receive the first indication signal, and an output terminal configured to output a second internal calibration signal, where the second internal calibration signal instructs the slave chip to perform the calibration.

For example, no matter in the command mode or the background mode, after the master chip 100 completes the ZQ calibration, the ZQ flag signal and the address signal are sent, and the second signal receiver 300 of the slave chip 101 performs address checking. The address signal transmitted through the second transmission terminal B is the same as the address signal of the slave chip 101 to which the second signal receiver 300 belongs. The first indication signal is generated. The third AND gate 301 generates the second internal calibration signal based on the first indication signal and the ZQ flag signal. The current slave chip 101 starts to perform the ZQ calibration based on the second internal calibration signal.

In the structure of the memory device shown in FIG. 1, only the master chip receives the ZQ calibration command, the first signal receiver 200 is integrated in the master chip, and the second signal receiver 300 is integrated in the slave chip, such that there is a difference in structure between the master chip and the slave chip. In some embodiments, the master chip and the slave chip have the same structure. That is, the master chip further includes the second signal receiver 300, and the slave chip further includes the first signal receiver 200. However, it should be noted that although the slave chip includes the first signal receiver 200, the slave chip may or may not receive the ZQ calibration command.

Referring to FIG. 4, the master chip and the slave chip each further include: a second input selector 401 having a third input terminal connected to the first output terminal, a first output terminal being an output terminal of the first signal receiver 200, a fourth input terminal connected to an output terminal of the third AND gate 301, a second selection terminal configured to receive a second indication signal or a third indication signal, and a second output terminal configured to output the first internal calibration command or the second internal calibration command, where the output terminal of the third AND gate 301 is an output terminal of the second signal receiver 300, the second indication signal indicates that the current chip is the master chip 100, the third indication signal indicates that the current chip is the slave chip 101, and the second input selector 401 is configured to connect the third input terminal to the second output terminal based on the second indication signal, or connect the fourth input terminal to the second output terminal based on the third indication signal; and a second output terminal is an output terminal of the second input selector 401.

In some embodiments, the second input selector 401 selects signal to output based on the second indication signal and the third indication signal. Receiving the third indication signal indicates that the current chip is the master chip. The second input selector 401 selects an output signal of the first signal receiver 200 to output. Receiving the third indication signal indicates that the current chip is the slave chip 101. The second input selector 401 selects an output signal of the second signal receiver 300 to output.

In some embodiments, the master chip 100 and the slave chips 101 are packaged in a same memory device.

In some embodiments, the master chip 100 and the slave chips 101 are packaged in different memory devices, and connection between the first transmission terminals A packaged in different memory devices and connection between the second transmission terminals B packaged in different are set by a wired or wireless interconnection between memory devices.

In the memory device provided in this embodiment, the first transmission terminals A of the master chip 100 and all the slave chips 101 are connected to a same bus, and the second transmission terminals B of the master chip 100 and all the slave chips 101 are connected to a same bus. That is, a broadcast loop is formed between the master chip 100 and all the slave chips 101 through two buses. In the process of performing the ZQ calibration, the master chip 100 first performs the ZQ calibration. After the master chip 100 completes the ZQ calibration, the address of one slave chip 101 is broadcasted, and the slave chip having the matched address performs the ZQ calibration based on the ZQ flag signal in response to the broadcasted address. After the slave chip completes the ZQ calibration, the ZQ flag signal is released. The master chip continues to broadcast the address of another slave chip 101, until all the slave chips 101 complete the ZQ calibration. All the chips are connected to the two buses, simplifying the design of a memory device package substrate.

It should be noted that when the ZQ calibration time is limited, the chips sharing the ZQ calibration resistor are also limited. The longer the time takes for each chip to perform the ZQ calibration, the fewer chips that share the ZQ calibration resistor. In addition, the features disclosed in the memory device provided by the above embodiment can be combined arbitrarily if there is no conflict, and a new embodiment of the memory device can be obtained.

Another embodiment of the present disclosure provides a ZQ calibration method, applied to the memory device according to the above embodiment, thereby realizing that a plurality of chips share the ZQ calibration resistor.

Figure 5:
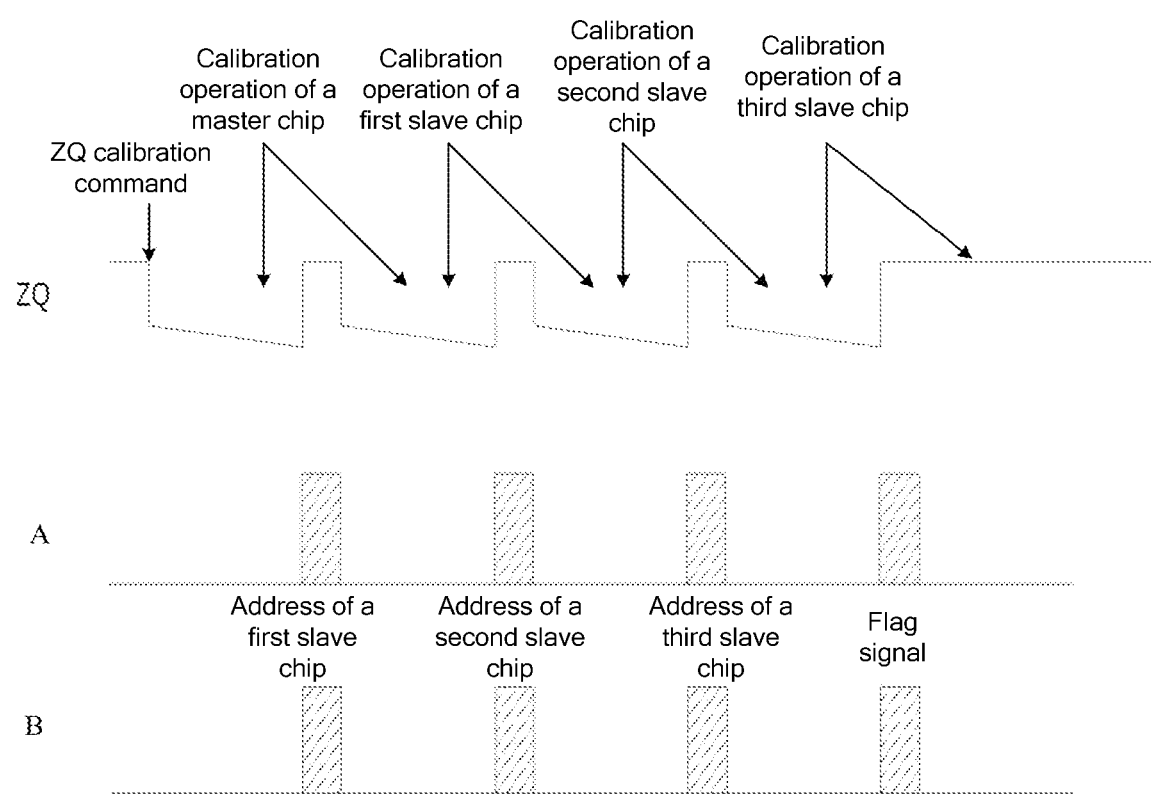
FIG. 5 is a schematic diagram of timing of ZQ calibration performed by a memory device according to another embodiment of the present disclosure.

FIG. 5 is a schematic diagram of timing of ZQ calibration performed by a memory device according to this embodiment. The ZQ calibration method according to this embodiment is described in detail below with reference to the accompanying drawings, and the details may be as follows:

Referring to FIG. 5, the ZQ calibration method includes: in a command mode, obtaining a ZQ calibration command applied outside the memory device, or in a background mode, obtaining a clock signal or a power-on signal applied outside the memory device; performing a first calibration on a master chip in response to the ZQ calibration command, a clock signal or a power-on signal; after the first calibration is completed, sending a ZQ flag signal and an address signal, and performing a second calibration on the master chip; performing, in response to the ZQ calibration command, the first calibration on a slave chip corresponding to the address signal; after the first calibration on the slave chip is completed, transmitting the ZQ flag signal again by the master chip, and performing the second calibration on the slave chip; resending the address signal by the master chip, and performing, in response to the ZQ calibration command, the first calibration on the slave chip corresponding to the address signal, until all the slave chips complete the first calibration; and after all the slave chips complete the first calibration, completing the second calibration on a slave chip that is the last one to complete the first calibration.

In the ZQ calibration method provided in this embodiment, the master chip firstly performs the ZQ calibration. After the master chip completes the ZQ calibration, the address of one slave chip is broadcasted, and the slave chip having the matched address performs the ZQ calibration based on the ZQ flag signal in response to the broadcasted address. After the slave chip completes the ZQ calibration, the ZQ flag signal is released. The master chip continues to broadcast the address of another slave chip, until all the slave chips complete the ZQ calibration, thereby realizing that a plurality of chips share a ZQ calibration resistor.

It should be noted that the schematic diagram of timing of ZQ calibration shown in FIG. 5 is described by taking three slave chips as an example, which is merely for those skilled in the art to know the realization of ZQ calibration in the embodiment of the present disclosure, and does not limit this embodiment. Based on the illustration of FIG. 5 and the ZQ calibration method mentioned above, those skilled in the art can continue to derive the timing in FIG. 5 to the situation applicable to N slave chips.

In some embodiments, the resending the address signal by the master chip further includes: after the master chip sends all the address signals, sending a flag signal by the master chip, where the flag signal indicates that all the chips complete the ZQ calibration, thereby facilitating subsequent design of memory circuit and signal timing.

It should be noted that the flag signal can be arbitrarily set as a signal that can be recognized by the memory, such as an address signal of the master chip. This embodiment does not constitute a limitation on the way of setting the flag signal. In a specific application, the setting of the flag signal can be set according to a specific application scenario.

In some embodiments, the master chip is further configured to sort the address signals of all the slave chips. The master chip sequentially sends the sorted address signals based on sorting of all the address signals.

In some embodiments, the master chip sends the address signals in response to the ZQ flag signal. Since the ZQ flag indicates that the chips complete the ZQ calibration, the address signals are sent according to the ZQ flag signal to start the ZQ calibration of a next slave chip, to avoid calibration timing disorder. In other embodiments, the address signals may also be sent at equal time intervals, that is, not limited by the ZQ flag signal.

In the ZQ calibration method provided in this embodiment, the master chip firstly performs the ZQ calibration. After the master chip completes the ZQ calibration, the address of one slave chip is broadcasted, and the slave chip having the matched address performs the ZQ calibration based on the ZQ flag signal in response to the broadcasted address. After the slave chip completes the ZQ calibration, the ZQ flag signal is released. The master chip continues to broadcast the address of another slave chip, until all the slave chips complete the ZQ calibration, thereby realizing that a plurality of chips share a ZQ calibration resistor.

It should be noted that in this embodiment, the first calibration is one of a pull-up calibration generating a pull-up calibration code and a pull-down calibration generating a pull-down calibration code, and the second calibration is the other one of the pull-up calibration and the pull-down calibration. In addition, the features disclosed in the ZQ calibration method according to the above embodiment can be combined freely without conflicts, and a new embodiment of the ZQ calibration method can be obtained.

The embodiments or implementations of this specification are described in a progressive manner, and each embodiment focuses on differences from other embodiments. The same or similar parts between the embodiments may refer to each other.

In the description of this specification, the description referring to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail referring to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the memory device and the ZQ calibration method provided in the embodiments of the present disclosure, the first transmission terminals of the master chip and all the slave chips are connected to a same bus, and the second transmission terminals of the master chip and all the slave chips are connected to a same bus. That is, a broadcast loop is formed between the master chip and all the slave chips through two buses. In the process of performing the ZQ calibration, the master chip first performs the ZQ calibration. After the master chip completes the ZQ calibration, the address of one slave chip is broadcasted, and the slave chip having the matched address performs the ZQ calibration based on the ZQ flag signal in response to the broadcasted address. After the slave chip completes the ZQ calibration, the ZQ flag signal is released. The master chip continues to broadcast the address of another slave chip, until all the slave chips complete the ZQ calibration. All the chips are connected to the two buses, simplifying the design of a memory device package substrate.

The invention claimed is:

1. A memory device, comprising:
   a master chip and a plurality of slave chips, wherein the master chip and the plurality of slave chips are connected to a same calibration resistor;
   the master chip and the plurality of slave chips are each provided with a first transmission terminal and a second transmission terminal, the first transmission terminal of the master chip and the first transmission terminals of the plurality of slave chips are connected to each other, and the second transmission terminal of the master chip and the second transmission terminals of the plurality of slave chips are connected to each other;
   the first transmission terminals are configured to transmit a ZQ flag signal, and the second transmission terminals are configured to transmit an address signal; and
   a first signal receiver and an address transmitter are provided in the master chip, and a second signal receiver is provided in each of the plurality of slave chip, wherein
   the first signal receiver is configured to receive, by a ZQ signal terminal, a ZQ calibration command provided by a memory, the master chip starts calibration based on the ZQ calibration command, the master chip sends the ZQ flag signal through the first transmission terminal after completing the calibration, and the ZQ flag signal indicates that a current chip has completed calibration by using the calibration resistor;

the address transmitter sends the address signal through the second transmission terminal, and the address signal represents an address of a slave chip in the plurality of slave chip which will perform ZQ calibration;

the second signal receiver is configured to match the address signal and receive the ZQ flag signal through the first transmission terminal, a slave chip in the plurality of slave chip matching the address signal starts the calibration based on the ZQ flag signal, and a current slave chip in the plurality of slave chip sends the ZQ flag signal through the first transmission terminal after completing the calibration; and the address transmitter continues to send a next address signal through the second transmission terminal, until the calibration of all of the plurality of slave chips is completed.

2. The memory device according to claim 1, wherein the address transmitter comprises:
an address storage unit, configured to store address signals of all of the plurality of slave chips; and
an address transmitting unit, connected to the address storage unit and configured to sequentially send the address signals of the plurality of slave chips.

3. The memory device according to claim 2, wherein the address transmitter further comprises:
an address sorting unit, connected to the address storage unit and the address transmitting unit and configured to sort all of the address signals, wherein the address transmitting unit sequentially sends the sorted address signals.

4. The memory device according to claim 1, wherein the address transmitter sequentially sends the address signals of the plurality of slave chips in response to the ZQ flag signal.

5. The memory device according to claim 1, wherein the master chip is further configured to send a flag signal after a last slave chip in the plurality of slave chip completes the ZQ calibration and releases the ZQ flag signal, wherein the flag signal indicates that all of the master chip and the plurality of slave chips have completed the ZQ calibration.

6. The memory device according to claim 1, wherein the first signal receiver comprises:
a first AND gate, having one input terminal configured to receive the ZQ calibration command and a second input terminal configured to receive a command indication signal, wherein the command indication signal indicates that the memory operates in a command mode;
a second AND gate, having one input terminal configured to receive a clock signal or a power-on signal and a second input terminal configured to receive a background indication signal, wherein the background indication signal indicates that the memory operates in a background mode; and
a first input selector, having a first input terminal connected to an output terminal of the first AND gate, a second input terminal connected to an output terminal of the second AND gate, a first selection terminal configured to receive the command indication signal or the background indication signal, and a first output terminal configured to output a first internal calibration signal, wherein the first internal calibration signal instructs the master chip to perform the calibration, and the first input selector is configured to connect the first input terminal to the first output terminal based on the command indication signal, or connect the second input terminal to the first output terminal based on the background indication signal; and the second signal receiver comprises:
a determination unit, configured to receive the address signal transmitted through the second transmission terminal, obtain the address signal of the slave chip to which the second signal receiver belongs, and send a first indication signal in response to the address signal transmitted through the second transmission terminal is the same as the address signal of the slave chip to which the second signal receiver belongs; and
a third AND gate, having one input terminal configured to receive the ZQ flag signal, a second input terminal configured to receive the first indication signal, and an output terminal configured to output a second internal calibration signal, wherein the second internal calibration signal instructs the slave chip to perform the calibration.

7. The memory device according to claim 6, wherein
the master chip further comprises the second signal receiver, and each of the plurality of the slave chip further comprises the first signal receiver; and
the master chip and the plurality of slave chips each further comprise: a second input selector having a third input terminal connected to the first output terminal, a fourth input terminal connected to the output terminal of the third AND gate, a second selection terminal configured to receive a second indication signal or a third indication signal, and a second output terminal configured to output the first internal calibration signal and the second internal calibration signal, wherein the second indication signal indicates that a current chip is the master chip, the third indication signal indicates that the current chip is a slave chip in the plurality of slave chips, and the second input selector is configured to connect the third input terminal to the second output terminal based on the second indication signal, or connect the fourth input terminal to the second output terminal based on the third indication signal.

8. The memory device according to claim 1, wherein the master chip and the plurality of slave chips are packaged in a same memory device.

9. The memory device according to claim 1, wherein the master chip and some of the plurality of slave chips are packaged in different memory devices, and connection between the first transmission terminals packaged in the different memory devices and connection between the second transmission terminals packaged in the different memory devices are implemented in a wired or wireless interconnection manner.

10. The memory device according to claim 1, wherein a number of the plurality of slave chips is the same as a number of binary data comprised in the address signal.

11. The memory device according to claim 2, wherein the address transmitter sequentially sends the address signals of the plurality of slave chips in response to the ZQ flag signal.

12. The memory device according to claim 3, wherein the address transmitter sequentially sends the address signals of the plurality of slave chips in response to the ZQ flag signal.

13. The memory device according to claim 2, wherein the master chip is further configured to send a flag signal after a last slave chip in the plurality of slave chip completes the ZQ calibration and releases the ZQ flag signal, wherein the flag signal indicates that all of the master chip and the plurality of slave chips have completed the ZQ calibration.

14. The memory device according to claim 3, wherein the master chip is further configured to send a flag signal after a last slave chip in the plurality of slave chip completes the ZQ calibration and releases the ZQ flag signal, wherein the flag signal indicates that all of the master chip and the plurality of slave chips have completed the ZQ calibration.

\* \* \* \* \*